(12) United States Patent
van Yperen et al.

(10) Patent No.: US 6,275,036 B1
(45) Date of Patent: Aug. 14, 2001

(54) MAGNETIC RESONANCE METHOD AND DEVICE

(75) Inventors: Gerrit H. van Yperen; Johan S. van den Brink; Hans G. Jenniskens, all of Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/439,241

(22) Filed: Nov. 12, 1999

(30) Foreign Application Priority Data

Nov. 18, 1998 (EP) .................................................. 98203881

(51) Int. Cl.⁷ .................................................. G01V 3/00
(52) U.S. Cl. ........................................... 324/307; 324/306
(58) Field of Search ..................... 324/309, 307, 324/306, 300, 312, 314, 313, 318

(56) References Cited

U.S. PATENT DOCUMENTS

| | | | |
|---|---|---|---|
| 5,285,158 | * 2/1994 | Mistretta et al. | 324/309 |
| 5,420,510 | * 5/1995 | Fairbanks et al. | 324/309 |
| 5,450,010 | * 9/1995 | Van Der Meulen et al. | 324/309 |

FOREIGN PATENT DOCUMENTS

577188A1   1/1994 (EP) ............................. G01R/33/56

OTHER PUBLICATIONS

"Phase Insensitive Preparation of Single–Shot RARE: Application to Diffusion Imaing in Humans" by David C. Alsop, in MRM vol. 38, pp. 527–533 (1977).

Alsop, D.C. : "Phase Insensitive Preparation of Single –Shot Rare: Application to Diffusion Imaging in Humans". Magnetic Resonance in Medicine, US, Academic Press, Duluth, MN, vol.–38, No. 4, pp. 527–533 XP000720006 ISSN: 0740–3194.

\* cited by examiner

*Primary Examiner*—Louis Arana
(74) *Attorney, Agent, or Firm*—John F. Vodopia

(57) ABSTRACT

The invention relates to a method for imaging diffusion parameters of a body by means of magnetic resonance. The method involves an adjustment pulse sequence and an imaging pulse sequence. The adjustment pulse sequence measures preparation MR signals. The imaging pulse sequence measures position-dependent MR signals. The imaging pulse sequence is adjusted on the basis of information from the preparation MR signals measured during the adjustment pulse sequence.

7 Claims, 3 Drawing Sheets

MAGNETIC RESONANCE METHOD AND DEVICE

BACKGROUND OF THE INVENTION

1. Field of the Invention

The invention relates to a method and device for imaging diffusion parameters of a body by means of magnetic resonance (MR).

2. Description of Related Art

In the context of the present application an MG (Meibohm, Gill) component is to be understood to mean a component of a transverse magnetization in the direction of a first axis of a rotating reference system, the magnetization being rotated about said first axis by the refocusing RF pulses. A method of the described kind is known form the article "Phase Insensitive Preparation of Single-Shot RARE: Application to diffusion Imaging in Humans", by D. C. Alsop, published in Magnetic Resonance in Medicine No. 38, pp. 527–533, 1997.

The known method is used for the in vivo imaging of diffusion phenomena in tissue of a human or animal body to be examined, for example the brain. The magnetization preparation pulse sequence of the known method includes, for example a gradient pair and a refocusing RF pulse for applying amplitude modulation which is dependent on diffusion of material in a part to be selected of the tissue of the body to be examined. An imaging pulse sequence which succeeds the magnetization preparation pulse sequence images the selected part of the tissue. The magnetic field gradients provide slice selection, phase encoding and frequency encoding of the MR signals, respectively. In order to reduce phase sensitivity in the successive MR signals, which sensitivity may be due to, for example motion of the body or motion of the tissue in the body during the magnetization preparation pulse sequence, a first crusher gradient is applied and the additional RF pulse is generated, respectively. The crusher gradient is a magnetic field gradient which causes a rotation of spins in such a manner that the magnetization due to the spins within a small area is distributed across the transverse plane relative to the steady magnetic field. The further first and second crusher gradients refocus and defocus the MG component. Subsequently, position-dependent MR signals are measured. A diffusion image of the selected part of the brain of the body to be examined is reconstructed from the measured position-dependent MR signals by means of two-dimensional transformation.

It is a drawback of the known method that artefacts occur in the image; for example, ghost images occur in the actual image of the part of the tissue. A ghost image is a second or subsequent image of the part of the tissue which has been shifted relative to the first image and has a reduced intensity.

Citation of a reference herein, or throughout this specification, is not to construed as an admission that such reference is prior art to the Applicant's invention of the invention subsequently claimed.

SUMMARY OF THE INVENTION

It is an object of the invention to provide a method which mitigates the artefacts in the reconstructed image. To this end, the method according to the invention is characterized in that it utilizes an adjustment pulse sequence which includes the following steps: generating a preparatory excitation RF pulse, applying a preparatory magnetization preparation pulse sequence, generating a preparatory additional RF pulse in order to select an MG component, generating preparatory refocusing RF pulses, applying first and second preparatory crusher magnetic field gradients in order to measure preparatory magnetic resonance signals in the adjustment pulse sequence, and adjusting the additional RF pulse in the imaging pulse sequence in dependence on a parameter which is determined from the preparatory MR signals measured in the adjustment pulse sequence. The invention is based on the recognition of the fact that deviations of the additional RF pulse relative to the desired RF pulse cause an additional modulation in the successive MR signals. The deviations may arise, for example due to amplitude and phase distortion in an RF chain for generating the RF pulses or due to eddy current effects caused by the application of the magnetic field gradients. Measurement of this modulation in the adjustment pulse sequence from successive preparatory MR signals and formation of a correction for the additional RF pulse in the imaging pulse sequence therefrom enable a reduction of the modulation in the MR signals wherefrom the diffusion image is reconstructed. This method also offers the advantage that it can be executed without requiring the intervention of an operator. The deviations which may occur concern the flip angle, being the angle wherethrough the magnetization is rotated, and deviations of the phase of the RF pulse relative to a phase of the refocusing RF pulses. It has been found that amplitude deviations are much more sensitive to a deviation of the additional RF pulse than to a similar deviation of the refocusing RF pulses, the refocusing RF pulses having a flip angle of approximately 180 degrees. The use of an adjustment pulse sequence is known per se from European patent application EP-A-577188. According to the method disclosed in the cited patent application an adjustment pulse sequence which is substantially identical to the spin echo imaging pulse sequence used is applied prior to a multiple spin echo imaging pulse sequence. The imaging pulse sequence includes an excitation RF pulse and a number of refocusing RF pulses. In the adjustment pulse sequence preparatory MR signals are measured and on the basis of the measured preparatory MR signals there is determined a correction whereby the phase of the excitation RF pulse of the imaging pulse sequence is adjusted so as to satisfy the CPMG condition.

According to a special version of the method according to the invention amplitude modulation of the position-dependent MR signals can thus be counteracted. The nominal flip angle of the additional RF pulse amounts to 90 degrees. Due to deviations of a nominal flip angle, the non-MG component is not completely rotated in the z direction and a residual non-MG component remains, giving rise to the amplitude modulation in successive MR signals. The correction of the nominal flip angle of the additional RF pulse can be determined by measurement of the amplitude of successive preparatory MR signals in the adjustment pulse sequence.

It has been found that amplitude deviations are much more sensitive to a deviation of the additional RF pulse than to a similar deviation of the refocusing RF pulses, the refocusing RF pulses having a flip angle of approximately 180 degrees.

According to another version of the method according to the invention, in order to satisfy the CPMG (Carr, Purcel, Meibohm, Gill) condition, in this pulse the nominal phase difference between the phase of the additional RF pulse and the phase of the refocusing RF pulses is chosen to be zero. The phase difference relative to the nominal phase difference produces a phase modulation in the phase of the successive MR signals. The phase correction for the phase of the additional RF pulse in the imaging pulse sequence is determined from the measured phase difference between two successive preparatory MR signals in the adjustment pulse sequence. The phase difference between successive MR signals, measured by means of an imaging pulse sequence, is thus constant. The phase differences of MR signals measured in successive imaging pulse sequences, however, may vary.

In a further version of the method according to the invention, one of the position-dependent MR signals is used as a navigator MR signal for relating the position-dependent MR signals measured in successive imaging pulse sequences to one another. The phase of successive imaging pulse sequences can be related to one another by measurement of a navigator signal.

The invention also relates to a device for carrying out such a method. A device of this kind comprises means for sustaining a steady magnetic field, means for applying gradients, means for generating RF pulses applied to the object to be examined in the steady magnetic field, a control unit for controlling the means for applying gradients and the means for generating RF pulses, and means for receiving and sampling magnetic resonance signals which are generated by pulse sequences containing RF pulses and gradients, wherein said control unit is also arranged to execute a method including, first, generating an imaging pulse sequence comprising generating an excitation RF pulse, executing a magnetic preparation pulse sequence in order to adjust a magnetization preparation, generating an additional RF pulse in order to eliminate a non-Meibohm-Gill (MG) component, generating refocusing RF pulses, and applying first and second crusher magnetic field gradients in order to measure position-dependent MR signals, and, second, generating an adjustment pulse sequence comprising generating a preparatory excitation RF pulse, applying a preparatory magnetization preparation pulse sequence, generating a preparatory additional RF pulse in order to select an MG component, generating preparatory refocusing RF pulses, applying first and second preparatory crusher magnetic field gradients, and measuring preparatory magnetic resonance signals, and wherein the control unit is also arranged to adjust the additional RF pulse in the imaging pulse sequence in dependence on a parameter which is determined from the preparatory MR signals measured in the adjustment pulse sequence.

BRIEF DESCRIPTION OF THE DRAWING

The above and other, more detailed aspects of the invention will be elucidated and described hereinafter, by way of example, with reference to the accompanying drawing. Therein.

DETAILED DESCRIPTION OF THE PREFERRED EMBODIMENT

Figure 1:
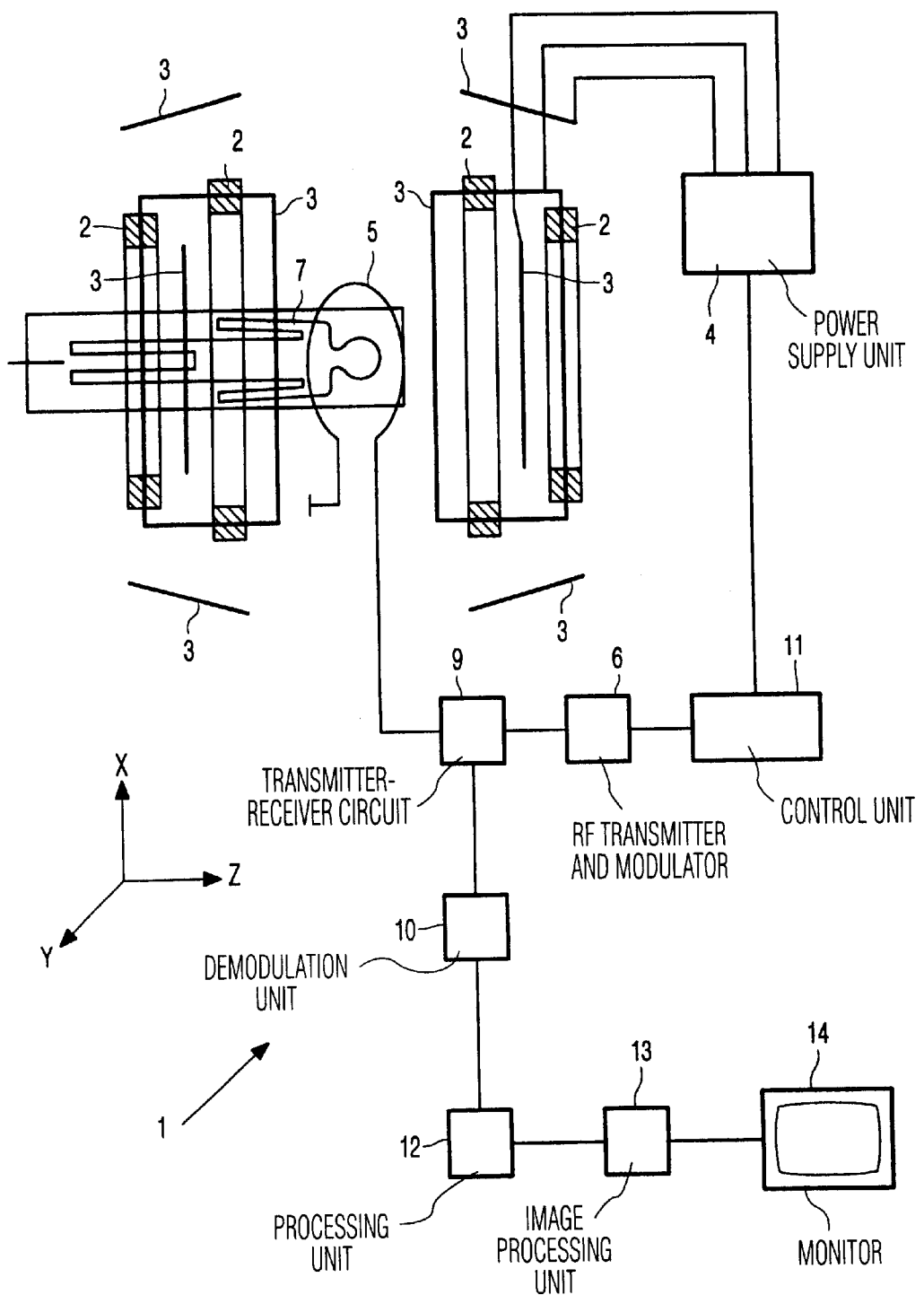
FIG. 1 shows a magnetic resonance device.

FIG. 1 shows a magnetic resonance imaging device which includes a first magnet system 2 for generating a steady magnetic field and also various gradient coils 3 for generating additional magnetic fields which are superposed on the steady magnetic field and cause a gradient in the steady magnetic field in three respective orthogonal directions of a system of co-ordinates X, Y, Z. By convention the Z direction of the system of co-ordinates shown corresponds to the direction of the steady magnetic field in the magnet system 2. A measuring co-ordinate system x, y, z (not shown) can be chosen independently of the X, Y, Z co-ordinate system shown in FIG. 1. Generally speaking, a gradient in the x direction is referred to as a read-out gradient, a gradient in the y direction as a phase encoding gradient and a gradient in the z direction as a selection gradient. The gradient coils 3 are fed by the power supply unit 4. The MRI device also includes an RF transmitter coil 5. The RF transmitter coil 5 serves to generate RF magnetic fields and is connected to an RF transmitter and modulator 6. A receiver coil is used to receive the magnetic resonance signal generated by the RF field in the object 7 to be examined in vivo, or in a part of the object, for example a human or animal body. The receiver coil may be the same coil as the RF transmitter coil 5. The magnet system 2 also encloses an examination space which is large enough to accommodate a part of the body 7 to be examined. Within this examination space the RF transmitter coil 5 is arranged around or on a part of the body 7 to be examined. The RF transmitter coil 5 is connected to a signal amplifier and demodulation unit 10 via a transmitter-reciever circuit 9. A control unit 11 controls the RF transmitter and modulator 6 and the power supply unit 4 in order to generate special imaging pulse sequences which contain RF pulses and gradients. The phase and amplitude obtained from the demodulation unit 10 are applied to a processing unit 12. The processing unit 12 processes the received signal values so as to form an MR image, for example by means of a two-dimensional Fourier transformation. An image processing unit 13 visualizes the MR image via a monitor 14. The invention will be described in detail with reference to the pulse sequence shown in the FIGS. 2 and 3.

Figure 2:
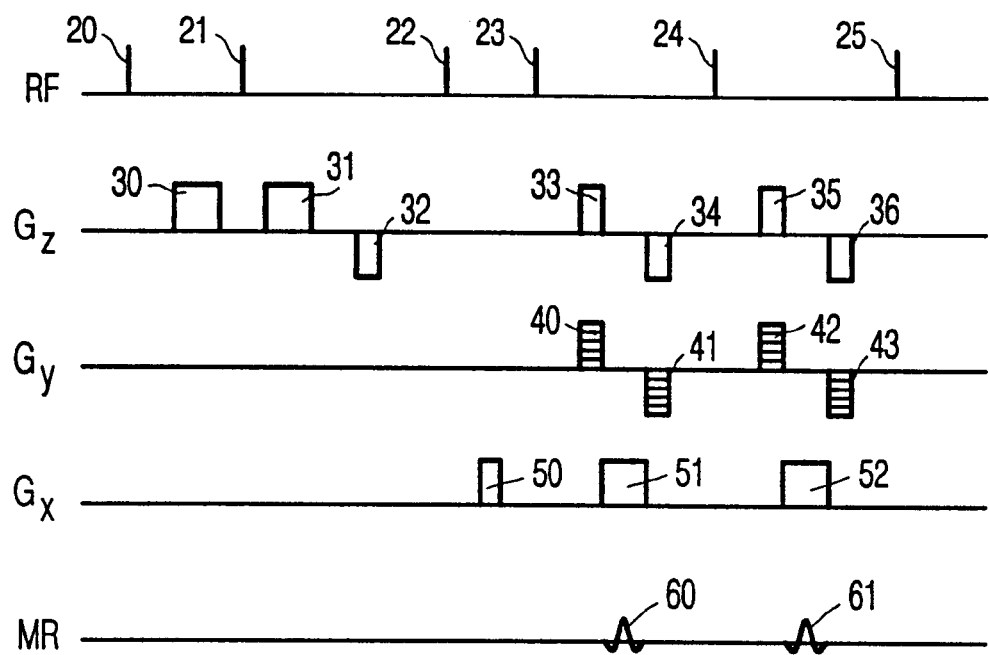
FIG. 2 shows an example of a known diffusion imaging pulse sequence.

FIG. 2 shows a known diffusion imaging pulse sequence which, in a first version of the method, is used to realize an in vivo MR image of, for example diffusion of material, for example intracellular fluid, in a part of the brain of the body to be examined. Like in FIG. 3, in FIG. 2 the time is plotted from left to right and the various rows represent the temporal relationship between the RF pulses to be generated, the gradients to be applied, and the MR signals to be measured. The upper row, denoted by the reference RF, shows the RF pulses to be generated; the three rows therebelow, denoted by the references $G_x$, $G_y$, $G_z$, show the gradients in the x, the y and the z direction, respectively. The row situated therebelow, denoted by the reference MR, shows the MR signals to be measured.

The diffusion imaging pulse sequence includes an excitation RF pulse 20, a magnetization preparation pulse sequence 30, 21, 31, an additional RF pulse 22 and refocusing RF pulses 24, 25. A diffusion imaging pulse sequence of this kind per se is known from the cited article "Phase Insensitive Preparation of Single-Shot RARE: Application to diffusion Imaging in Humans" by D. C. Alsop, published in Magnetic Resonance in Medicine No. 38, pp. 527–533, 1997. The excitation RF pulse 20 rotates the magnetization in a transverse plane of a rotating reference system x', y', z' (not shown) whose z direction corresponds to the direction of the steady magnetic field. The value of the flip angle normally amounts to 90 degrees. The magnetization preparation pulse sequence includes a magnetic field gradient pair 31, 32, separated by a refocusing RF pulse 21. The value of the flip angle of the refocusing RF pulse 21 normally amounts to 180 degrees. The gradient pair 30, 31 is oriented, for example in the z direction. A bipolar magnetic field gradient may be used instead of a magnetic field gradient pair 30, 31 and the refocusing RF pulse 21, the time integral of the two magnetic field gradients then being equal.

Another example of a magnetization preparation pulse sequence is a pulse sequence for the measurement of flow velocities, for example by means of an adapted stimulated echo pulse sequence as is known from the article "Discrimination of Different Types of Motion by Modified Stimulated echo NMR", published by J. E. M. Snaar et al in Journal of Magnetic Resonance 87, pp. 132–140, 1990.

Because of the magnetization preparation pulse sequence used in this example, the modulus of the magnetization is rendered dependent on diffusion of the material in the tissue. In order to make the multiple spin echo pulse sequence less sensitive to phase errors in the magnetization which are due to motion of the body to be examined during the application of the magnetic field gradient pair 30, 31, a first crusher gradient 32 is applied and an additional RF pulse 22 is generated.

The time integral of the first crusher gradient is sufficiently large to dephase spins in the selected part and to divide the magnetization into two components of approximately equal magnitude along the x' axis and the y' axis, respectively, of the rotating reference system (not shown). Subsequently, the additional RF pulse 22 rotates one of the two components in the direction of the z axis of the rotating reference system. If the axis of the rotating reference system about which the additional RF pulse 22 rotates the magnetization corresponds to the axis of the rotating reference system about which the magnetization is rotated by the respective refocusing RF pulses 23–25, the CPMG condition is satisfied by one of the two components of the magnetization divided by the crusher gradient. Normally speaking, the flip angle of the additional RF pulse 22 amounts to 90 degrees and the flip angles of the refocusing RF pulses 23–25 amount to 180 degrees. In order to measure the respective MR signals 60, 61, after an interval TE/2 in the imaging pulse sequence the first refocusing RF pulse 23 is generated and the second crusher gradient 33 is applied. Furthermore, phase encoding is applied by means of the first phase encoding gradient 40; after the measurement of the MR signal 60 this phase encoding is canceled by the second phase encoding gradient 41. Furthermore, a preparation read-out gradient 50 is applied between the additional RF pulse 22 and the first refocusing RF pulse 23. For the measurement of the MR signal 60 a first read-out gradient 51 is applied between the successive refocusing RF pulses 23, 24. The number of MR signals measured in practice amounts to, for example 16. Subsequently, while repeating the refocusing RF pulses 23 and applying the phase encoding gradients 40, 41 with a strength which increases in fixed steps, a set of MR signals 60, 61 is measured; these signals correspond to a number of lines in the $k_x$, $k_y$ plane of the k space. The number of lines normally amounts to, for example 64 or 128. In order to select a slice in the tissue of the body to be examined, a selection gradient is applied simultaneously with the generating of the RF pulses (not shown in FIG. 2). A first crusher gradient 34 is applied again after the measurement of the MR signal 60.

Figure 3:
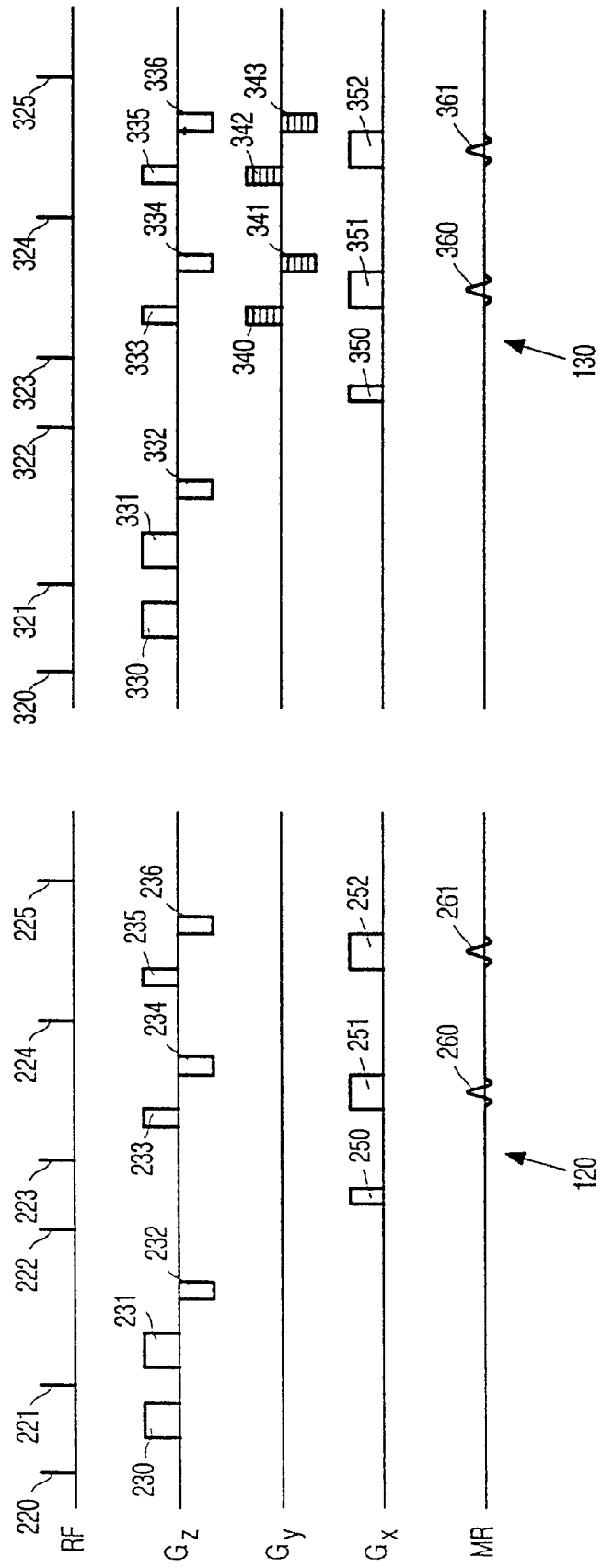
FIG. 3 shows a diffusion imaging pulse sequence according to the invention.

Deviations of the additional RF pulse 22 cause an undesirable modulation in the measured MR signals. For example, a deviation of the flip angle causes an amplitude modulation in the successive MR signals. A deviation of the phase of the additional RF pulse 22 relative to the phase of the refocusing RF pulses 23–25 causes an additional phase modulation of the MR signals 60, 61. Deviations may also be due to, for example amplitude and phase distortion in the RF chain for generating the RF pulses or due to eddy current effects caused by the application of magnetic field gradients. In order to counteract deviations of the additional RF pulse 22, according to the invention use is made of an adjustment pulse sequence which is executed prior to the imaging pulse sequence. FIG. 3 shows an example of an adjustment pulse sequence and the imaging pulse sequence according to the invention.

The adjustment pulse sequence 120 includes a preparatory excitation RF pulse 220, a preparatory magnetization preparation pulse sequence 230, 221, 231, a first preparatory crusher gradient 232, a preparatory additional RF pulse 222 for selecting an MG component, preparatory refocusing RF pulses 223–225, first and second preparatory crusher gradients 232, 236, a preparatory selection gradient (not shown), a preparatory preparation read-out gradient 250, and preparatory read-out gradients 251, 252 for the measurement of preparatory MR signals 260, 261. The execution of the adjustment pulse sequence 120 is analogous to that of the known imaging pulse sequence as described with reference to FIG. 2. However, no phase encoding gradients are applied. Furthermore, preferably only a first and a second preparatory MR signal 260, 261 are measured. FIG. 3 also shows an imaging pulse sequence 130. The imaging pulse sequence is identical to the imaging pulse sequence shown in FIG. 2, wherein the values of the reference numerals have been incremented by 300.

According to the method of the invention, the values of the flip angles of the preparatory additional RF pulse 222 and the preparatory refocusing RF pulses 223–225 are normally adjusted to 90 degrees and 180 degrees, respectively. The actual value of the flip angle, however, may deviate from its desired value. The adjustment of the additional RF pulse 322 in the imaging pulse sequence 130 is performed in dependence on a parameter which is determined from the first and the second preparatory MR signals 260, 261 measured in the adjustment pulse sequence 120.

For a better approximation of a desired nominal value of the flip angle of the additional RF pulse 322, amounting to 90°, according to the invention the measured flip angle is determined from the maximum values of the first and the second preparatory MR signal 260, 261 in conformity with:

$$\alpha_{act} = \arccos\left(\frac{e_1 - e_2}{e_2 + e_1}\right) \quad (1a)$$

or $$\alpha_{act} = \arccos\left(\frac{e_2 - e_1}{e_2 + e_1}\right) \quad (1b)$$

where $e_1$, $e_2$ represent the amplitude of a first and a second measured preparatory MR signal 260, 261, respectively, in the adjustment pulse sequence 120.

Furthermore, formula (1a) is used for a positive value of the first preparatory crusher gradient 232 and formula (1b) for a negative value of the first preparatory crusher gradient 232. From the difference between the flip angle to be adjusted for the preparatory additional RF pulse 222 and the measured flip angle there is derived a value which is to be adjusted for the flip angle of the additional RF pulse 322 in the imaging pulse sequence 130 in conformity with:

$$\alpha_2 = \frac{90}{\alpha_{act}} \cdot \alpha_1 \quad (2)$$

where $\alpha_{act}$ represents the measured flip angle of the preparatory additional RF pulse 222, $\alpha_1$ represents the flip angle to be adjusted for the preparatory additional RF pulse 222, and $\alpha_2$ represents the flip angle to be adjusted for the additional RF pulse 322.

In order to approximate the desired flip angle of the additional RF pulse 322 even better, if necessary, a second adjustment pulse sequence (not shown) may be executed; the flip angle to be adjusted for the additional RF pulse in the second adjustment pulse sequence is then determined from the first adjustment pulse sequence, the value of the flip angle to be adjusted for the additional RF pulse 322 in the imaging pulse sequence 130 being determined from the flip angle to be adjusted and the measured flip angle of the additional RF pulse of the second adjustment pulse sequence. Subsequently, the phase of the additional RF pulse 322 is corrected relative to the phase of the refocusing RF pulses 322–325 in the imaging pulse sequence 130. The desired difference between the phase of the additional RF pulse 322 and the phase of the refocusing RF pulses 322–325 is zero. In order to approximate this desired phase difference, first the measured phase difference between the phase of the preparatory additional RF pulse 222 and the phase of the preparatory refocusing RF pulses 223–225 is determined from the difference between the phases at the maximum values of the first and the second preparatory MR signal 260, 261, respectively, measured in the adjustment pulse sequence 120. The correction for the phase to be adjusted for the additional RF pulse 322 is then determined in conformity with the formula $$\delta_{act} = \frac{\varphi_2 - \varphi_1}{2} \quad (3)$$

where $\delta_{act}$ represents the correction, and $\psi_1, \psi_2$ represent the measured phases at the maximum value of the first and the second preparatory MR signal 260, 261, respectively.

The phase of the additional RF pulse in the imaging pulse sequence is then given by $$\phi_2 = \phi_1 + \delta_{act}$$

where $\phi_2$ is the phase to be adjusted for the additional RF pulse in the imaging pulse sequence, $\phi_1$ is the phase to be adjusted for the preparatory additional RF pulse in the adjustment pulse sequence, and $\delta_{act}$ represents said correction.

The phase of the MR signals measured in the same imaging pulse sequence thus remains constant. The phase of the MR signals measured in successive imaging pulse sequences, however, may vary. In order to relate the phases of measured imaging MR signals measured in successive imaging pulse sequences to one another, for example, the first measured MR signal 60 of each imaging pulse sequence may be used as a navigator signal, the first navigator MR signal being used as a reference for determining phase deviations relative to the subsequent navigator MR signals. Subsequently, the phases of the measured MR signals 61 can be corrected in a manner which is known to those skilled in the art.

All references cited herein, as well as the priority document European Patent Application 98203881.2 filed Nov. 18, 1998, are incorporated herein by reference in their entirety and for all purposes to the same extent as if each individual publication or patent or patent application was specifically and individually indicated to be incorporated by reference in its entirety for all purposes.

What is claimed is:

1. A method of imaging diffusion parameters of a body by means of magnetic resonance (MR) including:
   generating an imaging pulse sequence comprising
      generating an excitation RF pulse,
      generating a magnetization preparation pulse sequence for adjusting a magnetization preparation,
      generating an additional RF pulse in order to eliminate a non-Meibohm-Gill (MG) component,
      generating refocusing RF pulses, and
      applying first and second crusher magnetic field gradients in order to measure position-dependent MR signals, and
   generating an adjustment pulse sequence comprising
      generating a preparatory excitation RF pulse,
      applying a preparatory magnetization preparation pulse sequence,
      generating a preparatory additional RF pulse in order to select an MG component,
      generating preparatory refocusing RF pulses,
      applying first and second preparatory crusher magnetic field gradients, and
      measuring preparatory magnetic resonance signals,
   wherein the additional RF pulse in the imaging pulse sequence is adjusted in dependence on a parameter which is determined from the preparatory MR signals measured in the adjustment pulse sequence.

2. A method as claimed in claim 1 wherein the measured preparatory MR signals in the adjustment pulse sequence comprise a first and a second preparatory MR signal, and wherein the adjustment of the flip angle of the additional RF pulse is dependent on the amplitudes of the measured first and second preparatory MR signals in the adjustment pulse sequence.

3. A method as claimed in claim 1 wherein the measured preparatory MR signals in the adjustment pulse sequence comprise a first and a second preparatory MR signal, and wherein the adjustment of the phase of the additional RF pulse relative to the phase of the refocusing RF pulses is dependent on the phases of the measured first and second preparatory MR signal in the adjustment pulse sequence.

4. A method as claimed in claim 1 wherein the preparatory magnetization preparation pulse sequence in the adjustment pulse sequence and the magnetization preparation pulse sequence in the imaging pulse sequence include a magnetic field gradient pair and a refocusing RF pulse.

5. A method as claimed in claim 1 wherein the preparatory magnetization preparation pulse sequence in the adjustment pulse sequence and the magnetization preparation pulse sequence in the imaging pulse sequence include a bipolar magnetic field gradient.

6. A method as claimed in claim 1 wherein one of the position-dependent MR signals is used as a navigator MR signal for relating the position-dependent MR signals measured in successive imaging pulse sequences to one another.

7. A magnetic resonance device for imaging an object to be examined which is arranged in a steady magnetic field comprising:

means for sustaining a steady magnetic field, means for applying gradients, means for generating RF pulses applied to the object to be examined in the steady magnetic field, a control unit for controlling the means for applying gradients and the means for generating RF pulses, and means for receiving and sampling magnetic resonance signals which are generated by pulse sequences containing RF pulses and gradients, wherein said control unit is also arranged to execute a method including:

generating an imaging pulse sequence comprising
   generating an excitation RF pulse,
     executing a magnetic preparation pulse sequence in order to adjust a magnetization preparation,
     generating an additional RF pulse in order to eliminate a non-Meibohm-Gill (MG) component,
     generating refocusing RF pulses, and
     applying first and second crusher magnetic field gradients in order to measure position-dependent MR signals, and generating an adjustment pulse sequence comprising
   generating a preparatory excitation RF pulse,
   applying a preparatory magnetization preparation pulse sequence,
   generating a preparatory additional RF pulse in order to select an MG component,
   generating preparatory refocusing RF pulses,
   applying first and second preparatory crusher magnetic field gradients, and
   measuring preparatory magnetic resonance signals, and wherein the control unit is also arranged to adjust the additional RF pulse in the imaging pulse sequence in dependence on a parameter which is determined from the preparatory MR signals measured in the adjustment pulse sequence.

* * * * *